United States Patent
Kagawa et al.

[11] Patent Number: 5,828,526
[45] Date of Patent: Oct. 27, 1998

[54] MAGNETORESISTANCE EFFECT ELEMENT AND MAGNETIC FIELD DETECTION DEVICE

[75] Inventors: Kiyoshi Kagawa; Yoichi Negoro; Akihiko Okabe, all of Kanagawa; Hiroshi Kano, Miyagi, all of Japan

[73] Assignee: Sony Corporation, Tokyo, Japan

[21] Appl. No.: 690,756

[22] Filed: Aug. 1, 1996

[30] Foreign Application Priority Data

Aug. 3, 1995 [JP] Japan ................................... 7-218051

[51] Int. Cl.⁶ ........................... G11B 5/39; H01L 43/00
[52] U.S. Cl. .................. 360/113; 324/252; 338/32 R; 428/692; 428/900
[58] Field of Search ........................... 360/113; 324/252, 324/207.21; 338/32 R, 32 H; 365/8, 157, 158; 428/332, 336, 611, 692, 694 T, 694 TM, 694 BA, 694 BM, 900

[56] References Cited

U.S. PATENT DOCUMENTS

| | | | |
|---|---|---|---|
| 5,341,118 | 8/1994 | Parkin et al. | 360/113 |
| 5,341,261 | 8/1994 | Dieny et al. | 360/113 |
| 5,465,185 | 11/1995 | Heim et al. | 360/113 |
| 5,549,978 | 8/1996 | Iwasaki et al. | 360/113 |
| 5,585,986 | 12/1996 | Parkin | 360/113 |

OTHER PUBLICATIONS

IEEE Trans. on Mag. "Study of SAL-biased MR Heads . . . " vol. 30, No. 6, Nov. 1994, Guo et al.

Primary Examiner—David L. Ometz
Attorney, Agent, or Firm—Hill & Simpson

[57] ABSTRACT

A magnetoresistance effect element is provided with a magnetoresistance effect film (MR film) formed of alternative laminations of magnetic layers (for example, soft magnetic layers such as Fe—Ni—Co alloy layers) which are coupled anti-ferromagnetically with each other between adjacent magnetic layers and non-magnetic layers (for example, non-magnetic layers such as Cu layers) and provided with a bias soft magnetic layer (for example, SAL layer) for application of a bias magnetic filed to the magnetoresistance effect film, where the anisotropic magnetic field (Hk) in the plane of the bias medium layer is 5 Oe $\leq$ Hk $\leq$ 15 Oe.

5 Claims, 7 Drawing Sheets

MAGNETORESISTANCE EFFECT ELEMENT AND MAGNETIC FIELD DETECTION DEVICE

BACKGROUND OF THE INVENTION

1. Field of the Invention

This invention relates to a magnetoresistance effect element and magnetic field detection device.

2. Description of Related Art

Magnetoresistance effect films have been used popularly in the fields of magnetic sensors, magnetic heads, rotation detection elements, and position detection elements as magnetoresistance effect elements for detecting a magnetic field.

To utilize a magnetoresistance effect element as a magnetic field detection device such as a magnetic sensor, a sense current to be fed to a magnetoresistance effect element and a bias magnetic field applying means for adjusting the angle of magnetization of the magnetoresistance effect element to about 45 degrees are required to obtain the sufficient sensitivity to a magnetic field and sufficient linear response.

As such a bias magnetic field applying means, a structure comprising the laminate of a magnetic layer having magnetoresistance effect, a magnetic insulation layer, and a soft magnetic layer placed in the order is known, and it is known that using this structure, a bias magnetic field is applied. (For example, N. Smith, IEEE Trans. on Magn., MAG-23, 259 (1987)).

In detail, a magnetoresistance effect element 10 shown in FIG. 9 is formed by a method in which an MR layer 2 consisting of a ferromagnetic material (magnetoresistance effect layer, for example, Ni—Fe alloy with a film thickness of 20 to 50 mm) is formed on an insulator substrate 1 consisting of glass or ferrite by sputtering or vacuum evaporation, a magnetic insulation layer 3 consisting of Ti, Mo, Cr, or Ta is formed on the MR layer 2 in the same manner as described herein above, and a Ni—Fe alloy or an amorphous soft magnetic layer (SAL layer) 4 is formed on the insulator layer 3 in the same manner as described herein above, and a sense current is fed between the terminal electrodes 5a–5b.

The sense current branch-flows to the MR layer 2, the magnetic insulator layer 3, and the soft magnetic layer 4 individually, the currents which flow through the MR layer 2 and the magnetic insulator layer 3 generate a magnetic field which passes in the plane of the soft magnetic layer 4 and is perpendicular to the sense current, the magnetic field rotates the magnetization direction of the soft magnetic layer 4. The magnetic field generated by the magnetization of the soft magnetic layer 4 and the magnetic field generated by the current flowing in the magnetic insulator layer 3 and the soft magnetic layer 4 generate in the plane of the MR layer 2 a magnetic field in the reverse direction to that of the magnetic field which is formed in the plane of the soft magnetic layer 4, and this magnetic field serves as a bias magnetic field.

Conventionally, Ni—Fe alloy films (what is called permalloy film) have been popularly used as the magnetoresistance effective film (MR layer 2). However, the rate of magnetic resistance change of permalloy is small, the permalloy is insufficient for higher density magnetic recording.

On the other hand, recently a multi-layer magnetic resistance effect film comprising an artificial lattice film structure formed by alternate laminations of different metal thin layers with a thickness of several atoms attracts attentions. It is reported that an artificial lattice film comprising laminations of ferromagnetic films of Fe and conductor films of Cr (non-magnetic film) has a magnetic resistance change rate of as high as about 50 to 60% (referred to as giant magnetoresistance (GMR) effect hereinafter), and the application to magnetoresistance elements is promising. (Physical Review Letters, Vol. 61, p. 24 (1988)).

Afterwards, it is reported that also a combination of the ferromagnetic layers of Co and non-magnetic layers of Cu shows the giant magnetoresistance effect in addition o a combination of Fe layers and Cr layers. (Physical Review Letters, Vol. 66, p. 21, (1991)).

The giant magnetoresistance effect of the multi-layer magnetoresistance effect film having the artificial lattice film structure comprising alternate laminations of ferromagnetic films and non-magnetic films described herein above is attributed to a mechanism in which the RKKY (Rudennan, Kittel, Kasuya, and Yoshida) interaction is exerted between ferromagnetic films through conduction electrons in the conductor, facing ferromagnetic films coupled together antimagnetically to generate a condition of an anti-parallel spin alignment, and the anti-parallel spin alignment results in spin dependent scattering.

In the case in which a GMR film having such a giant magnetoresistance effect is used as an MR layer 2, the non-magnetic layer thickness which gives the highest magnetic field sensitivity has the saturation magnetic field (Hs) of 50 Oe or higher, and has the saturation magnetization of as low as 0.2 T because of lamination film including the non-magnetic layers. A soft magnetic material of typical permalloy with a saturation magnetization of 0.8 T is used as an SAL film to apply a bias; in this case, the influence of a demagnetizing field is very different between the SAL layer and the GMR layer because the magnetization is larger for the SAL film than for the GMR film, for example four times larger, when the size of the films is, for example, about 50 to 60 nanometers in thickness and several microns in width, where such a size is typical for typical magnetoresistance effect elements.

In detail, the spread of magnetization inversion area of the SAL layer and the GMR layer in the case that the layers have the shape typical for regular magnetoresistance effect elements is the sum of a saturation magnetic field (Hs) or an anisotropic magnetic field (Hk) inherent for the SAL layer of the GMR layer and a demagnetizing field dependent on the shape. Therefore, for the SAL layer, the spread of a magnetization inversion area is the sum of an anisotropic magnetic field Hk of as high as several Oe and a demagnetizing field of several tens Oe which is influenced by the shape, and it is influenced severely by the shape. On the other hand, for a GMR layer, the spread of a magnetization inversion area is the sum of the inherent saturation magnetic field Hs of 50 Oe or higher which is not dependent on the shape and the small demagnetizing field due to low magnetization (Ms), and it is influenced not severely by the shape.

In the case of SAL bias applications, for the GMR layer the magnetization inversion area is shifted reversely from approximate zero magnetic field by the magnetic field of a demagnetizing field magnitude level of the SAL layer, and for the SAL layer the magnetization inversion area is shifted reversely from approximate zero magnetic field by the magnetic field of a demagnetizing field magnitude level of the GMR layer and the magnetic field generated by the current in the GMR layer. When the shift of the magnetization inversion area of the SAL layer is not sufficient on the reason described herein above, and the magnetization inversion area of the SAL layer overlaps on the magnetization inversion area of the GMR layer, then a flat area corresponding to the magnetization inversion of the SAL layer appears on the magnetic resistance curve (MR curve), and deficiency of dynamic range is caused as described hereinafter in FIG. 3.

It is considered to avoid such a problem that a current flowing through the GMR layer is increased to increase the shift of the magnetization inversion area of the SAL layer (in other words, the flat area shown in FIG. 3 is shifted to the right), but such current increase is limited because of degradation of the performance of the elements due to temperature increase by heating and migration by the current.

When the width of the elements is changed while the thickness of the SAL layer and the GMR layer is maintained constant, the overlapping of the magnetization inversion area of the SAL layer and the GMR layer is significantly different depending on the influence on the demagnetizing field based on the unbalance of the saturation magnetization. As the result, when the width of the elements is changed to, for example, 2, 5, and 10 $\mu$m, the flat area of an MR curve by magnetization inversion of the SAL layer approaches to the zero magnetic field in some cases, and in such situation, the performance of an element will change dramatically during the service life of the MR element. This type of change is a problem.

It is considered to solve the problem of the unbalanced saturation magnetization hat the magnetization of permalloy is reduced by adding, for example, Ta in permalloy. However, the addition of Ta is accompanied with a reduction of the Curie point, and when a sufficient bias current is fed, the current causes the temperature increase and results in the reduced shift of the peak in the MR curve, and therefore this method also involves a limitation.

OBJECT AND SUMMARY OF THE INVENTION

It is an object of the present invention to provide an MR element and a magnetic field detection device using a linear responding MR effect element having a magnetoresistance effect film formed of alternate laminations of non-magnetic layers and magnetic layers; the MR element maintains the linearity of an MR curve, has a sufficient dynamic range, and has stable element characteristics regardless of different element widths even if the magnetoresistance effect film and a medium layer for application of bias magnetic field are made of the same material when an indispensable bias magnetic field is applied.

The magnetoresistance effect element is provided with a magnetoresistance effect film (MR film) formed of alternate laminations of magnetic layers (for example, soft magnetic layers such as Fe—Ni—Co alloy layer) coupling anti-ferromagnetically each other between adjacent magnetic layers and non-magnetic layers (for example, non-magnetic layers such as Cu layers) and provided with a bias soft magnetic layer (for example, an SAL layer) for application of a bias magnetic field to the magnetoresistance effect film, the anisotropic magnetic field (Hk) in the plane of the bias medium layer is 5 Oe$\leq$Hk$\leq$15$\leq$Oe.

According to the present invention, the SAL layer with a relatively large anisotropic magnetic field Hk of as high as 5 Oe$\leq$Hk$\leq$15 Oe is used, and therefore it is found that the magnetization inversion area of the SAL layer does not appear as a flat area on an MR curve even if the combination with the MR film is used, and the linear area of the MR curve is obtained over the wide magnetic field range.

In detail, the result of a simulation shown in FIG. 1 reveals that a crease is found near the zero magnetic field on the MR curve when the anisotropic magnetic field Hk$\leq$5 Oe, and on the other hand, the magnetic field sensitivity is reduced when the anisotropic magnetic field Hk>15 Oe.

The inventors of the present invention found that the use of the SAL layer with the larger anisotropic magnetic field Hk of 5 to 15 Oe than that of a conventional SAL layer (smaller than several Oe, for example, 1 Oe) is the important factor to obtain linear magnetoresistance effect without serious degradation of the magnetic field sensitivity.

DETAILED DESCRIPTION OF THE PRESENTLY PREFERRED EMBODIMENTS

Figure 6:
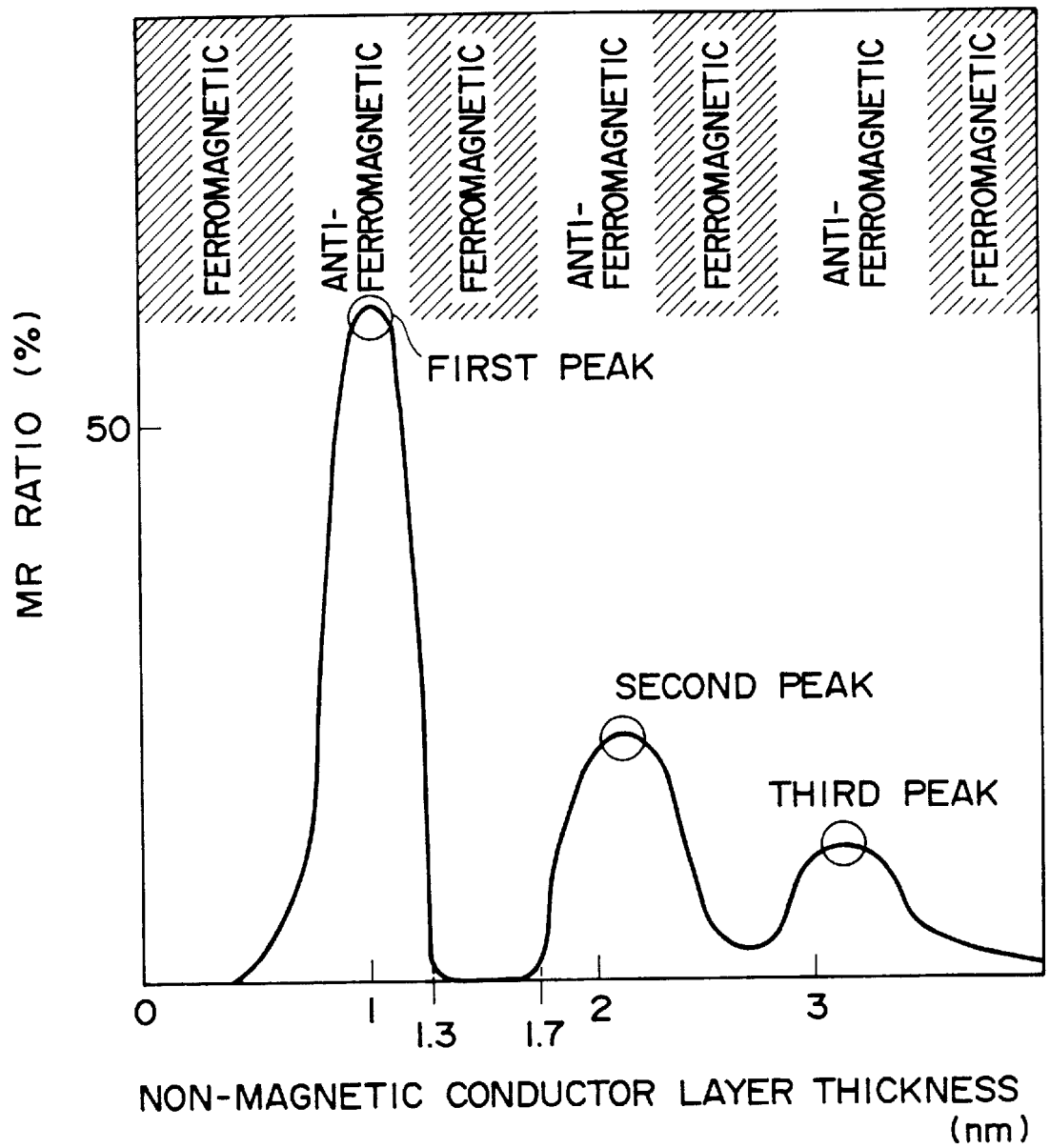
FIG. 6 is a graph for describing changes in magnetoresistance effect depending on the thickness of the non-magnetic layer of a magnetoresistance effect element.

An MR element of the present invention has a combination structure of an SAL layer of 5 Oe$\leq$Hk$\leq$15 Oe and a GMR film comprising the alternate laminations of non-magnetic conductor layers and soft magnetic layers, as shown in FIG. 6. It is found that, in the laminated layer of non-magnetic conductor layers and soft magnetic layers, there are areas where adjacent soft magnetic layers are coupled together anti-ferromagnetically and different areas where adjacent magnetic layers are coupled together ferro-magnetically with increasing of the thickness of the non-magnetic conductor layers. A GMR effect is manifested in the anti-ferromagnetically coupled area at the first peak around the non-magnetic layer thickness of about 1 nm, at the second peak around about 2.2 nm, and at the third peak around about 3.2 nm, and the ferromagnetically coupled area behaves like a ferromagnetic material of 5 Oe$\leq$Hk$\leq$15 Oe. Therefore, the above-mentioned SAL layer of 5 Oe$\leq$Hk$\leq$15 Oe is easily realized by prescribing the thickness of the non-magnetic conductor layer and using an alternately laminated film comprising non-magnetic conductor layers and soft magnetic layers in which adjacent soft magnetic layers are coupled together ferromagnetically. Particularly, it is preferable from the practical view point that a non-magnetic conductor layer with a thickness of 1.3 to 1.7 nm is used (in such range, the GMR effect is scarcely manifested).

In the magnetoresistance effect film, the thickness of non-magnetic layers (non-magnetic conductor layer) is prescribed so that adjacent magnetic layers (soft magnetic layer) are coupled anti-ferromagnetically. The bias soft magnetic layer (SAL layer) is formed of the alternate laminations of magnetic layers (soft magnetic layer) and non-magnetic layers in which adjacent magnetic layers (soft magnetic layer) are coupled ferromagnetically with each other. The thickness of non-magnetic layers is prescribed so that adjacent soft magnetic layers are coupled ferromagnetically in the bias soft magnetic layer.

When the bias soft magnetic layers (SAL layer) which is formed of the alternate laminations of magnetic layers (soft magnetic layer) and non-magnetic layers in which adjacent magnetic layers (soft magnetic layer) are coupled ferromagnetically with each other is used, the same target or vacuum evaporation source as used for film forming of the GMR film in sputtering or vacuum evaporation is used, and therefore it is not necessary to use a new target or vacuum evaporation source for this purpose. The saturation magnetization of the whole SAL layers can be adjusted desirably by changing the thickness of each soft magnetic layer to be laminated, and therefore the SAL layer with a saturation magnetization and matched to the GMR layer is obtained without lowering of the Curie point.

As materials used for the above-mentioned magnetic layer, materials known to manifest a giant magnetoresistance effect by laminating them alternately with non-magnetic layers consisting of a non-magnetic material such as Cu, for example, Ni—Fe—Co, Ni—Fe, and Co are used, but laminations of Ni films and Fe films or Ni—Fe alloy films may be used. Between the magnetoresistance effect film and the bias soft magnetic film layer, a magnetic insulator layer of Ta or Ti may be provided.

The above-mentioned magnetoresistance effect film may be formed on a non-magnetic substrate; typically an $Al_2O_3$—TiC substrate or an $Al_2O_3$—TiC substrate coated with $Al_2O_3$ is used as the non-magnetic substrate. Otherwise, substrates of glass, photoserum, quartz glass, and polyimide, and substrates of single crystal of GaAs, Si, and MgO in view of epitaxial growth may be used.

The Young's modulus of non-magnetic substrate is desirably $1 \times 10^9$ Nm$^{-2}$ or higher. The Young's modulus lower than this value causes strains in the magnetoresistance effect film and the degradation of magnetoresistance effect.

The magnetoresistance effect is measured by measuring magnetoresistance using a four terminal method and calculating the rate of change ($\Delta\rho/\rho_o$) (the same hereinafter).

The present invention provides a magnetic field detection device having the magnetoresistance effect element with the above-mentioned structure, for example, playback head.

Embodiments in which the present invention is applied are described in detail referring to the drawings hereinafter.

First Embodiment

Figure 4:
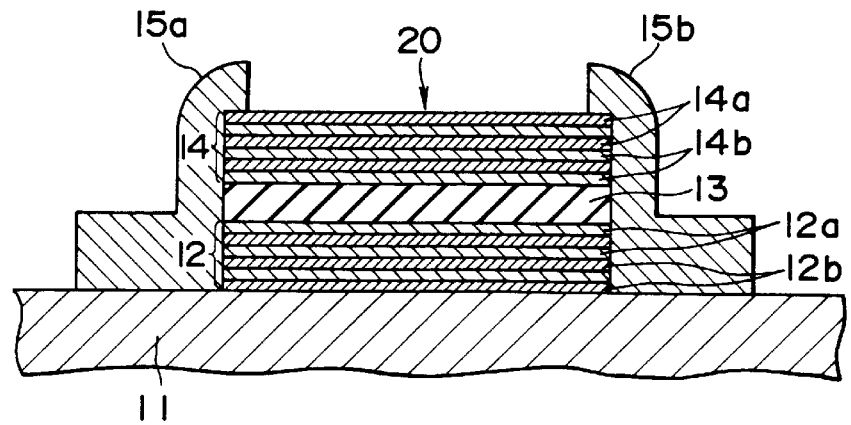
FIG. 4 is a schematic cross-sectional view (cross-sectional view along the line IV—IV in FIG. 5) for illustrating an example of a magnetoresistance effect element in accordance with the present invention.
Figure 5:
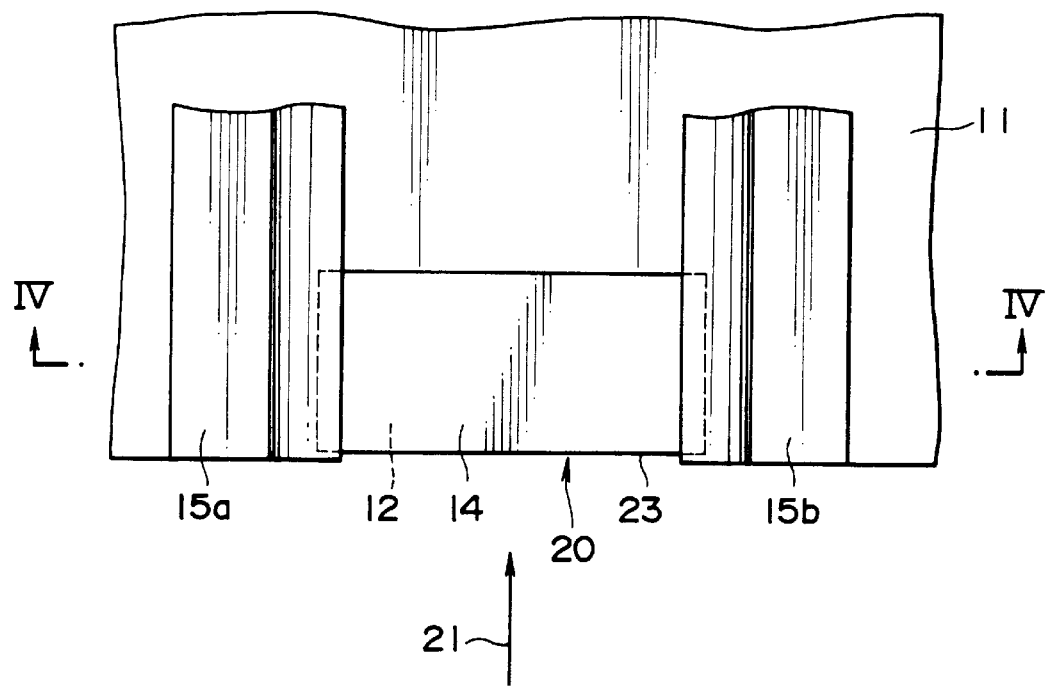
FIG. 5 is a plane view of the magnetoresistance effect element in FIG. 4.

An MR element 20 shown in FIG. 4 and FIG. 5 comprises a GMR layer 12 having twelve alternate laminations of $Fe_{25}Ni_{45}Co_{30}$ layers 12a with a thickness of 1 nm and Cu layers 12b with a thickness of 2.3 nm, a magnetic insulator layer 13 of Ta with a thickness of 10 nm, and an SAL layer 14 having twelve alternate laminations of $Fe_{25}Ni_{45}Co_{30}$ layers 14a with a thickness of 1 nm and Cu layers 14b with a thickness of 1.5 nm. An anisotropic magnetic field Hk of the laminated SAL layer 14 is 10 Oe. Each laminate layer has twelve alternate laminations but the laminations are shown schematically in FIG. 4.

The above-mentioned each layer of this MR element 20 is formed by a thin film process; three types of MR elements which have 2, 3, and 5 $\mu$m width stripes, respectively, are fabricated; electrodes 15a and 15b formed of the lamination of a Cr layer with a thickness of 5 nm and an Au layer with a thickness of 100 nm are provided only at the opposite ends of the element. The above-mentioned layers are all formed by DC magnetron sputtering.

Figure 2:
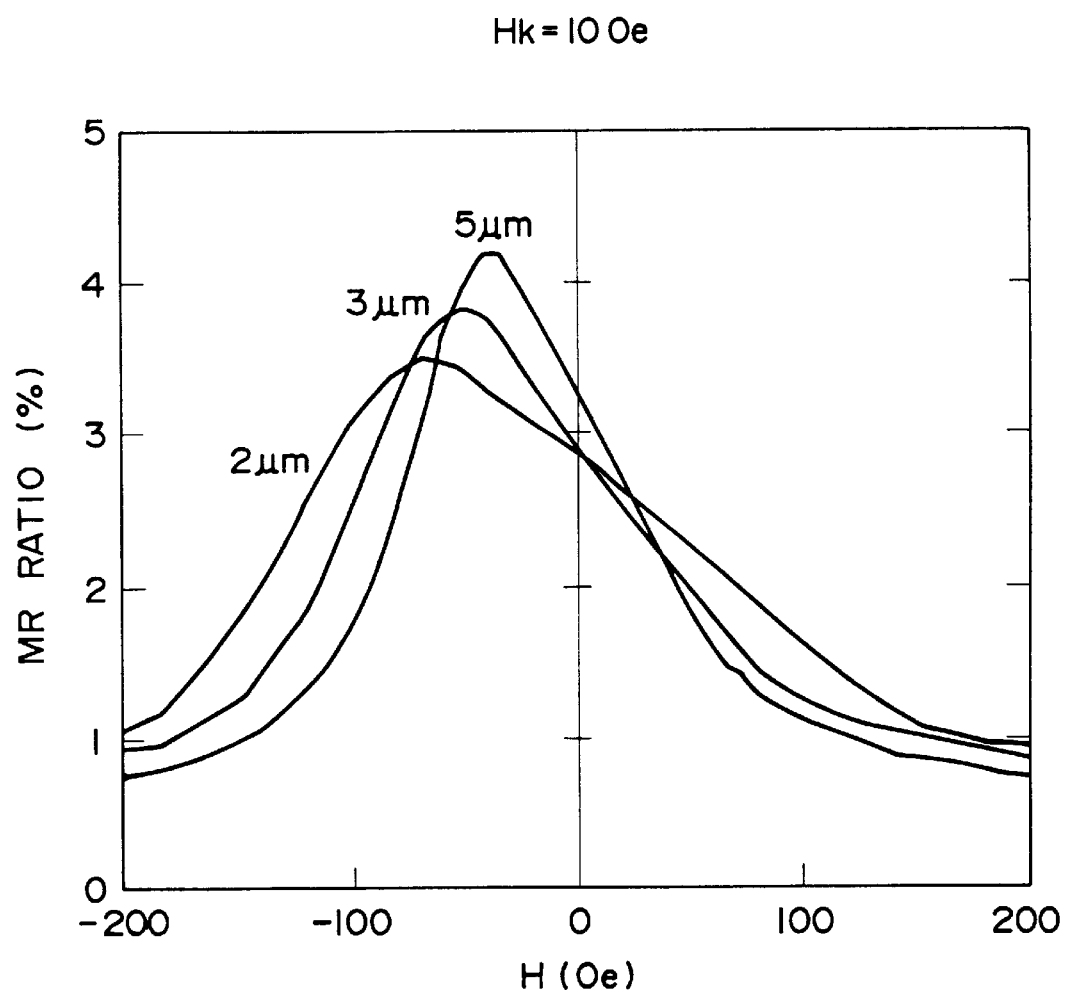
FIG. 2 is another graph similar to FIG. 1 for another the anisotropic magnetic field Hk.

FIG. 2 is a graph which is obtained when a magnetic field is applied in the width direction of each element having a width of 2, 3, or 5 $\mu$m as described herein above. From this figure it is obvious that there is no flat area corresponding to magnetization inversion of the SAL layer 14 on the MR curve. The reason is that the thickness of the non-magnetic layers (Cu) 12b of the GMR layer 12 is prescribed to 2.3 nm so that the soft magnetic layers 12a are coupled anti-ferromagnetically and the thickness of the non-magnetic layers (Cu) 14b is prescribed to 1.5 nm so that the soft magnetic layers 14a are coupled ferromagnetically described hereinbefore in FIG. 6.

In FIG. 2 it is obvious that the linearity around the zero magnetic field, which is important as element characteristics, is almost same for all elements regardless of different element widths (the change corresponding to what is called depth in which the width of a film is removed partially by a magnetic recording medium during the service life of, particularly, a contact type MR sensor) though the film thickness structures of the GMR layers 12 and the SAL layers 14 are the same.

Figure 9:
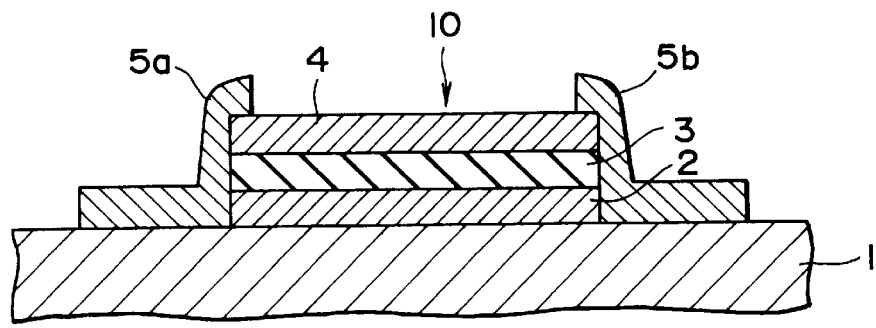
FIG. 9 is a schematic cross-sectional view for illustrating a conventional magnetoresistance effect element.

Next, for comparison, the results for the combination of the GMR and SAL layers of $Fe_{19}Ni_{78}Ta_5$ with an anisotropic magnetic field Hk of 1 Oe is shown. As shown in FIG. 9, the same SAL layer as used in the first embodiment excepting that a single layer of $Fe_{19}Ni_{76}Ta_5$ with a thickness of 35 nm is used as the SAL layer 4 is used.

Figure 3:
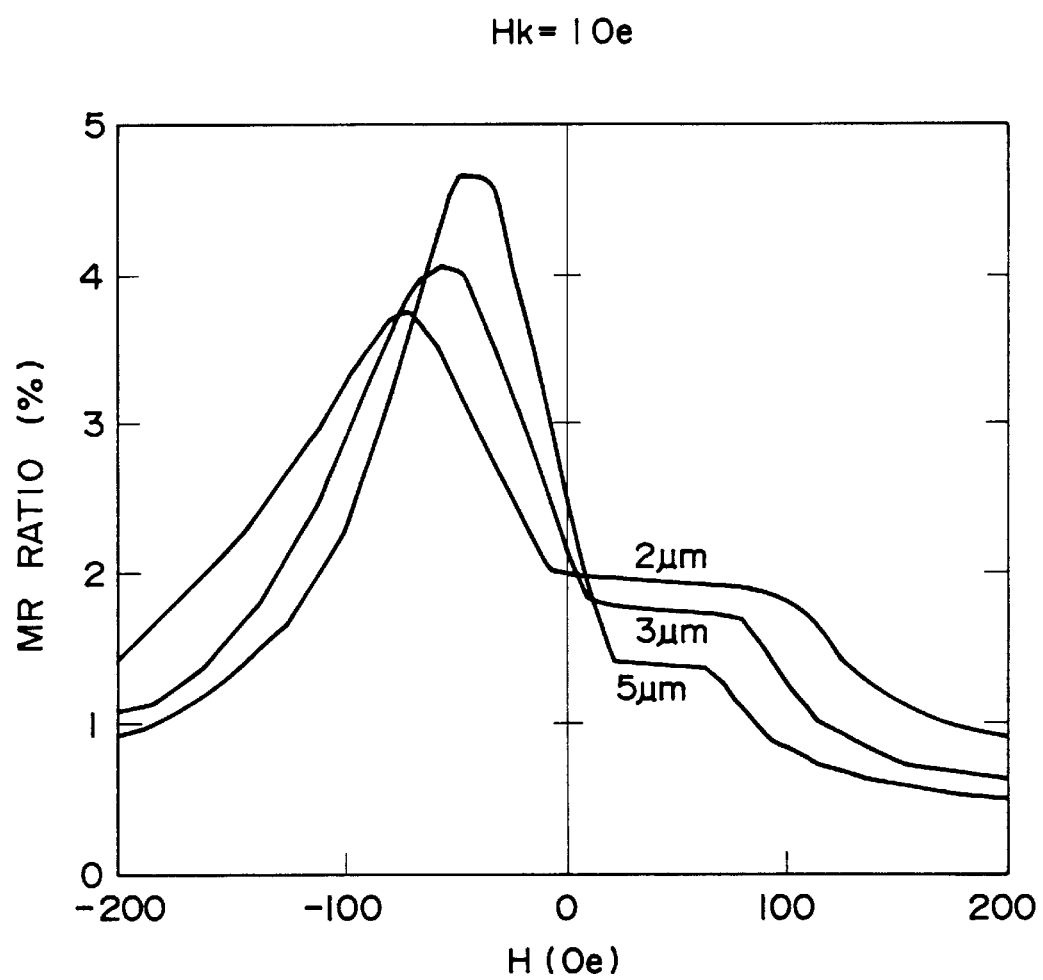
FIG. 3 is a graph for describing the magnetoresistance effect characteristics when conventional SAL layers with small anisotropic magnetic fields Hk are used.

In FIG. 3, MR curves obtained when a magnetic field 21 is applied in the width direction of elements having widths of 2, 3, and 5 $\mu$m individually for the above-mentioned comparative embodiment are shown. It is obvious from the set of the MR curves that: a flat area due to magnetization inversion of the SAL layer 4 appears on the MR curves to suggest the restriction on the dynamic range; the element width is changed due to partial removal of the width by a magnetic recording medium though the film thickness structure of the GMR layer and the SAL layer is the same; the linearity around the zero magnetic field and the magnetic field area due to the magnetization inversion of the SAL layer are changed depending on the element width; thus, the element characteristics change rapidly.

Figure 1:
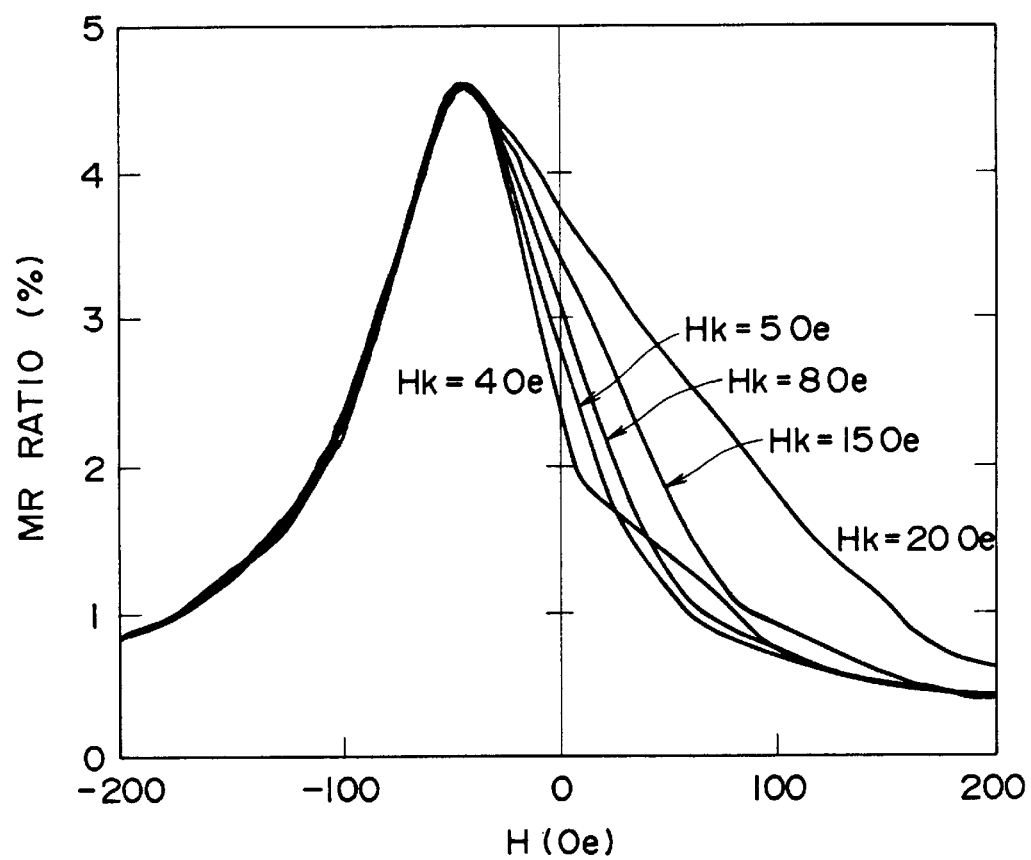
FIG. 1 is a graph for describing comparatively the magnetoresistance effect characteristics by the anisotropic magnetic field (Hk) of the bias soft magnetic layer (SAL layer) of a magnetoresistance effect element.

From the data in FIG. 1, it is found that, when the element width of 5 $\mu$m is used consistently, the SAL layer with an anisotropic magnetic field Hk of as high as 5 Oe$\leq$Hk$\leq$15 Oe is used, and the combination of this SAL layer and the GMR layer is used, the magnetization inversion of the SAL layer does not appear as the flat area on the MR curve for the same element structure shown in FIG. 4. Therefore, the linearity of the MR curve is obtained over the wide range of magnetic field, and the magnetic field sensitivity of the element is also improved. In other words, the use of an SAL layer having the anisotropic magnetic field Hk of 5 Oe to 15 Oe results in the linearity with an MR change rate of 1.5% or higher in the external magnetic field range of −30 Oe to 30 Oe.

MR curves shown in FIG. 1, FIG. 2, and FIG. 3 are obtained under test conditions in which a current is adjusted for each element width to the current density of about $10^7$ A/cm$^2$ that is the allowable maximum current density being not involved in the electro migration problem for the magnetoresistance effect element.

As described hereinbefore, according to the present invention, when a GMR layer comprising alternate laminations of non-magnetic conductor layers and soft magnetic layers are used as the MR element having linear response capability, the linearity of the MR curve does not degrade, and there is no flat area corresponding to magnetization inversion of the SAL layer which restricts the dynamic range when an indispensable bias magnetic field is applied. With the same film thickness structure of the GMR layer and the SAL layer, the element characteristics are stable regardless of different element widths, thus the MR element which is stable in the element characteristics during service even if it is used as a contact MR sensor is realized.

Second Embodiment

Figure 7:
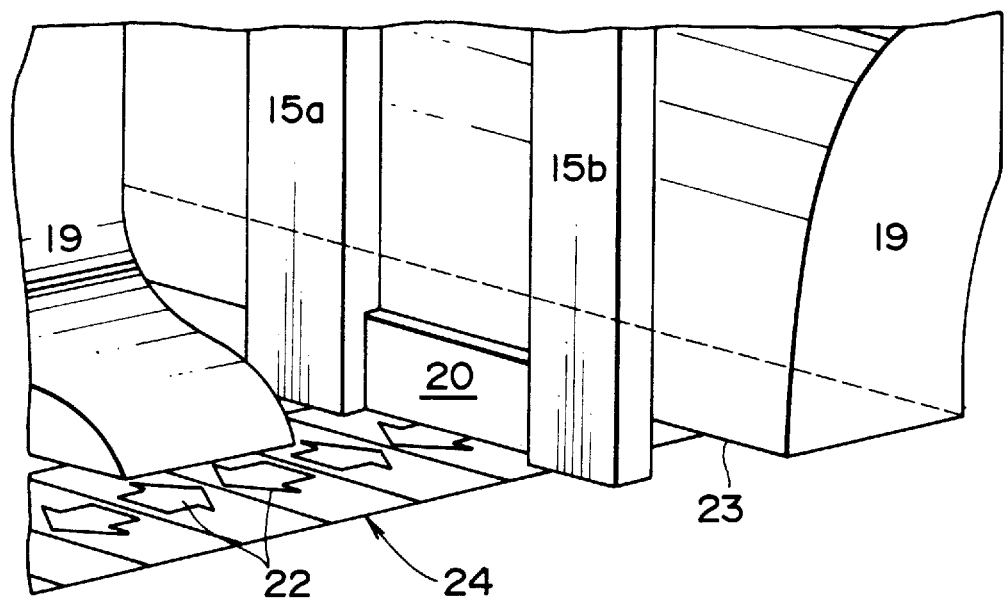
FIG. 7 is a partial perspective view of a playback head which uses the magnetoresistance effect element.
Figure 8:
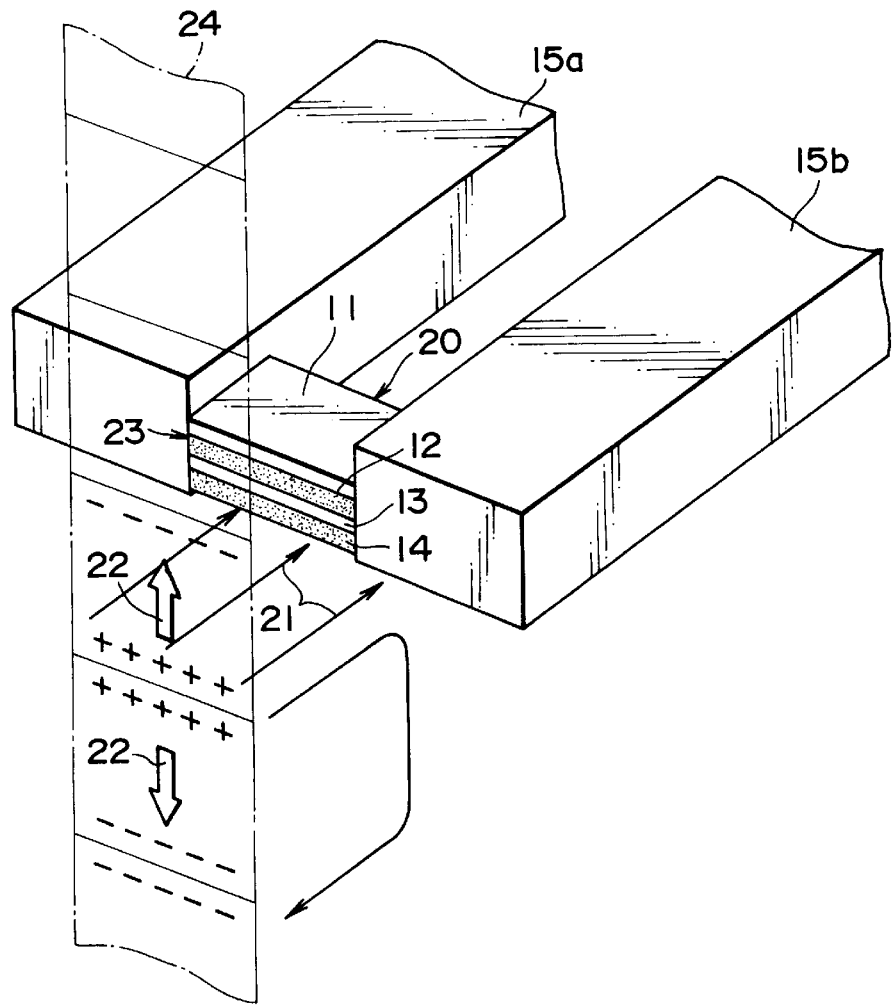
FIG. 8 is a schematic perspective view for illustrating the action of a signal magnetic field by a magnetic recording medium.

FIG. 7 and FIG. 8 show an example of application of an MR element 20 described in the first embodiment to the playback head of a recording/playback combined thin film head for hard disk driving. This playback head comprises a structure in which electrodes 15a and 15b are connected to the element 20, and the element 20 is sandwiched between top and bottom magnetic shields 19. The playback head has a function to play back signal magnetic field 21 from the magnetic recording medium 24. In the figure, signs of +, − represent magnetic poles in magnetization areas; arrow 22 represents the direction of magnetization spin; numeral 23 represents a plane facing to the medium (ABS plane).

For playing back using such a playback head, the facing plane 23 is faced to a recording track of the magnetic recording medium 24 such as a magnetic tape. A sense current I is fed between the electrodes 15a–15b through the magnetoresistance effect element 20. The changes in magnetoresistance caused by changes in the direction of the magnetic field recorded on the recording track of the magnetic recording medium 24 are detected as voltage changes between the electrodes 15a and 15b. The playback performance of the head is greatly improved by utilizing the element characteristics described in the description of the first embodiment.

Embodiments of the present invention are described herein above, the embodiments described herein above may be modified based on the technical principle of the present invention.

For example, the number of laminated layers, the thickness of layers, and material of layers of the above-mentioned MR element or head are not limited to those described herein above. In particular for the SAL layer, the thickness of the non-magnetic layer is prescribed in a range where an anisotropic magnetic field Hk ranges from 5 to 15 Oe. The thickness of the magnetic layer is changed to change the saturation magnetization and to match with the saturation magnetization of the GMR layer. The position of the SAL layer 14 and the GMR layer 12 may be reversed (that is, the SAL layer 14 and the GMR layer 12 may be positioned at the top and at the bottom respectively).

The structure of the above-mentioned head may be modified so as to match for various applications such as a magnetic field detection head.

Although DC magnetron sputtering is used in the above-mentioned embodiments, other sputtering methods may be used for film forming. Other than sputtering, vacuum evaporation may be used for film forming.

The element in accordance with the present invention is provided with the magnetoresistance effect film (MR film) formed of alternate laminations of magnetic layers (for example, soft magnetic layer such as Fe—Ni—Co alloy layer) which are coupled ferromagnetically with each other between adjacent magnetic layers and alternate laminations of non-magnetic layers (for example, non-magnetic layers such as Cu layers), and provided with a bias soft magnetic layer (for example, SAL layer) for applying a bias magnetic field to the magnetoresistance effect film, wherein the anisotropic magnetic field (Hk) in the plane of the bias soft magnetic layer is as high as $5 \text{ Oe} \leq Hk \leq 15 \text{ Oe}$. Thus, the combination of the SAL layer with such an anisotropic magnetic field Hk and the MR layer results in no appearance of the flat area on the MR curve corresponding to the magnetization inversion of the SAL layer. Therefore, the linearity of the MR curve is obtained over the wide magnetic field range.

What is claimed is:

1. A magnetoresistance effect element comprising:

a magnetoresistance effect film formed of alternate laminations of first magnetic layers and first non-magnetic layers, said first magnetic layers coupling anti-ferromagnetically with each other between said adjacent first magnetic layers, and a soft magnetic layer provided on said magnetoresistance effect film for applying a bias magnetic field to said magnetoresistance effect film, said soft magnetic layer formed of alternate laminations of second magnetic layers made of the same material as said first magnetic layers and second non-magnetic layers made of the same material as said first non-magnetic layers, said second magnetic layers coupling ferromagnetically with each other between said adjacent second magnetic layers, said second non-magnetic layers having a thickness different from a thickness of said first non-magnetic layers as to exhibit a ferromagnetic coupling as opposed to an anti-ferromagnetic coupling in said magnetoresistance effect film.

2. The magnetoresistance effect element as claimed in claim 1, wherein an anisotropic magnetic field (Hk) of said soft magnetic layer is $5 \text{ Oe} \leq Hk \leq 15 \text{ Oe}$.

3. The magnetoresistance effect element as claimed in claim 1, wherein a magnetic insulator layer is provided between said magnetoresistance effect film and said soft magnetic layer.

4. The magnetoresistance effect element as claimed in claim 1, wherein said second non-magnetic layers of said soft magnetic layer exhibit characteristics of anti-ferromagnetic coupling and ferromagnetic coupling alternatively as a thickness of said second non-magnetic layers increases, and wherein said second non-magnetic layers of said soft magnetic layer have the thickness exhibiting the characteristics of the ferromagnetic coupling between two thinner thickness ranges exhibiting the characteristics of the anti-ferromagnetic coupling.

5. The magnetoresistance effect element as claimed in claim 4, wherein the thickness of said second non-magnetic layers is in the range from 1.3 to 1.7 nm.

* * * * *